US006664837B1

(12) United States Patent
Oh et al.

(10) Patent No.: US 6,664,837 B1
(45) Date of Patent: Dec. 16, 2003

(54) DELAY LINE TRIM UNIT HAVING CONSISTENT PERFORMANCE UNDER VARYING PROCESS AND TEMPERATURE CONDITIONS

(75) Inventors: Kwansuhk Oh, Campbell, CA (US); Raymond C. Pang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/247,241

(22) Filed: Sep. 18, 2002

(51) Int. Cl.[7] ............................................... H03H 11/26
(52) U.S. Cl. ....................................... 327/270; 327/272
(58) Field of Search ................................. 327/237, 251, 327/258, 259, 269, 270, 271, 272

(56) References Cited

U.S. PATENT DOCUMENTS

| 5,012,141 | A | * | 4/1991 | Tomisawa ..................... 327/276 |
| 5,210,450 | A | | 5/1993 | Parkinson |
| 5,465,076 | A | | 11/1995 | Yamauchi et al. |
| 5,719,514 | A | | 2/1998 | Sato |
| 5,781,056 | A | | 7/1998 | Fujii |
| 5,949,269 | A | | 9/1999 | Allen |
| 6,204,710 | B1 | | 3/2001 | Goetting et al. |
| 6,304,124 | B1 | * | 10/2001 | Mizuno ........................ 327/281 |

FOREIGN PATENT DOCUMENTS

| EP | 0 621 689 A1 | 10/1994 |
| JP | 5-191 233 | 7/1993 |

* cited by examiner

Primary Examiner—Kenneth B. Wells
(74) Attorney, Agent, or Firm—Lois D. Cartier (57) ABSTRACT

A delay circuit has a delay that is consistent under varying process and temperature conditions. The delay through a delay path is controlled by inserting resistors on the pull-up and pull-down paths of the delaying inverters. Each resistor has a resistance value that is determined by a varying a number of enabled similarly-sized transistors coupled in parallel across the resistor, rather than by varying the size of a single transistor. In one embodiment, a first transistor in each resistor is always enabled, while additional transistors are enabled using select signals. In one embodiment, the select signals are provided by configuration memory cells in a PLD. Other embodiments include additional delay paths and a multiplexer circuit that selects one of the delay paths. The described delay circuit is particularly useful in a DLL trim unit, where variations between resistors can cause jitter and locking problems in the DLL.

29 Claims, 5 Drawing Sheets

DELAY LINE TRIM UNIT HAVING CONSISTENT PERFORMANCE UNDER VARYING PROCESS AND TEMPERATURE CONDITIONS

FIELD OF THE INVENTION

The invention relates to delay lines in integrated circuits (ICs). More particularly, the invention relates to a delay line trim unit that exhibits consistent performance under varying process and temperature conditions, such trim units being particularly useful in the design of delay-lock loop circuits (DLLs).

BACKGROUND OF THE INVENTION

Clock signals are used in virtually every IC and electronic system to control timing. For example, every time there is a rising edge on a clock signal, all the flip-flops in a circuit might change state. Clearly, clocks are often heavily loaded signals, and can be bussed throughout a very large IC. Even with specially-designed global buffers, there is typically a delay (a "clock skew") between the clock edge received by the IC at the pad, and the clock edge received by the last-served flip-flop on the IC (i.e., between the "input clock signal" and the "destination clock signal"). This delay can cause difficulties in interfacing between ICs, or can simply slow down the overall system speed.

For example, input data is typically provided in synchronization with an input clock signal, while output data is typically provided in synchronization with a destination clock signal. Further, the skew between the two clock signals often varies not only between different ICs, but on a single IC with temperature and voltage as well. Thus, clock signals are typically synchronized, e.g., using a delay-lock loop circuit (DLL).

Figure 1:
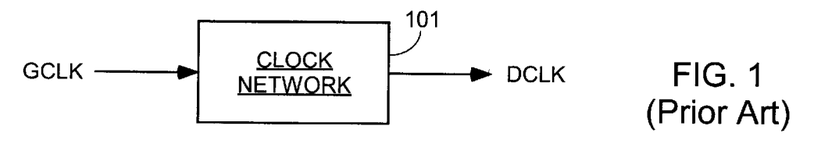
FIG. 1 is a high-level block diagram of a first IC clock circuit.
Figure 1A:
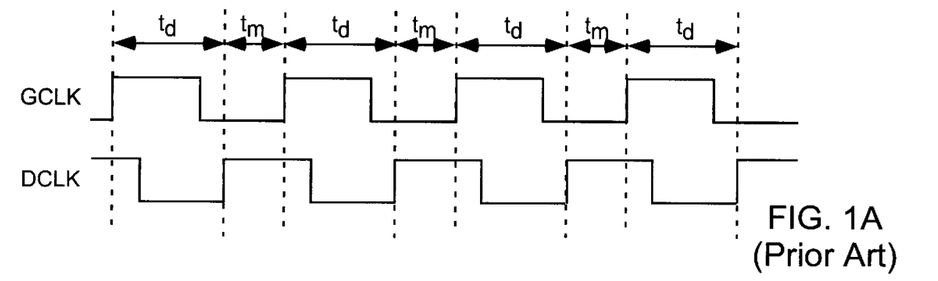
FIG. 1A is a waveform diagram of the IC clock circuit of FIG. 1.

FIGS. 1 and 1A illustrate clock skew in a typical IC. FIG. 1 shows an input clock signal GCLK, which is distributed through clock network 101 to provide delayed clock signal DCLK. The delay (skew) between signals GCLK and DCLK is designated as "td" in FIG. 1A. Delay "tm" is the amount of time by which signal DCLK would have to be delayed to bring signals DCLK into synchronization with input clock signal GCLK.

Figure 2:
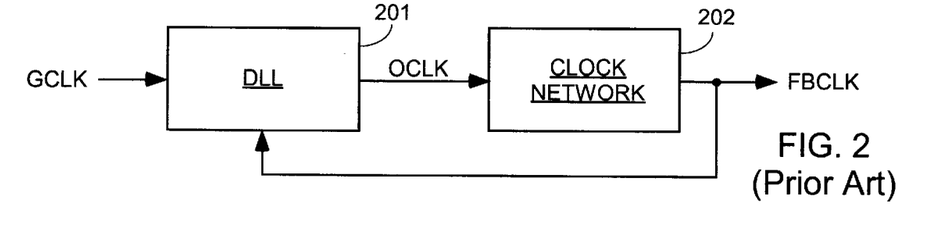
FIG. 2 is a high-level block diagram of a second IC clock circuit that includes a clock network and a delay-lock loop circuit (DLL).
Figure 2A:
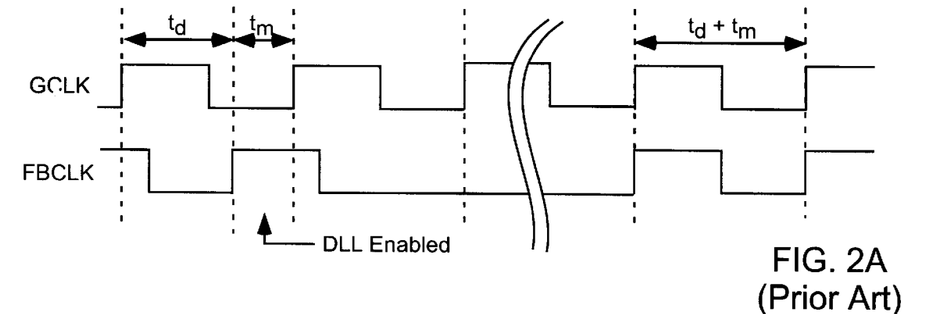
FIG. 2A is a waveform diagram of the IC clock circuit of FIG. 2.

FIGS. 2 and 2A illustrate the use of a DLL to synchronize signals DCLK and GCLK. The DLL 201 adds an additional delay "tm" to the path between input clock signal GCLK and the output/feedback clock signal, which in FIG. 2 is designated FBCLK. DLL 201 determines the value of delay "tm" by comparing the feedback clock signal FBCLK to the input clock signal GCLK, and inserts a delay of "tm" into the clock path. Clock network 202 adds additional delay "td", as in FIG. 1. As a result, when the DLL is enabled and an initial synchronization period has elapsed, feedback clock signal FBCLK is synchronized with input clock signal GCLK, as shown in FIG. 2A. Each clock signal has a period of "td+tm".

Figure 3:
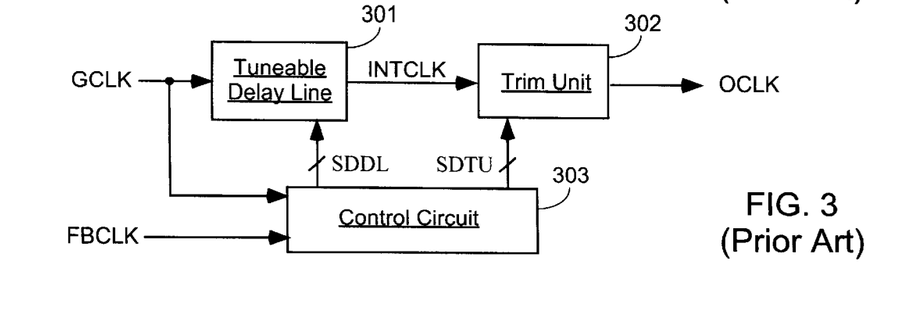
FIG. 3 is a block diagram of a DLL that can be used in the IC clock circuit of FIG. 2.

DLLs are well known in the art of IC design. Therefore, detailed DLL implementations are not described herein. However, FIG. 3 shows a block diagram of a common type of DLL. The DLL of FIG. 3 includes a tuneable delay line 301, a trim unit 302, and a control circuit 303. Each of delay line 301 and trim unit 302 delays input signal GCLK, but delay line 301 performs a coarse adjustment (i.e., inserts a relatively larger delay), while trim unit 302 performs a more fine-tuned adjustment (i.e., inserts a relatively smaller delay).

The delay inserted by the trim unit is typically less than twice the minimum delay that can be inserted by delay line 301. For example, the delay inserted by the trim unit can be one unit delay of the delay line plus a small incremental delay of a few tens of picoseconds. Control circuit 303 determines the magnitude of the inserted delays, controlling delay line 301 via select signals SDDL and trim unit 302 via select signals SDTU.

Figure 4:
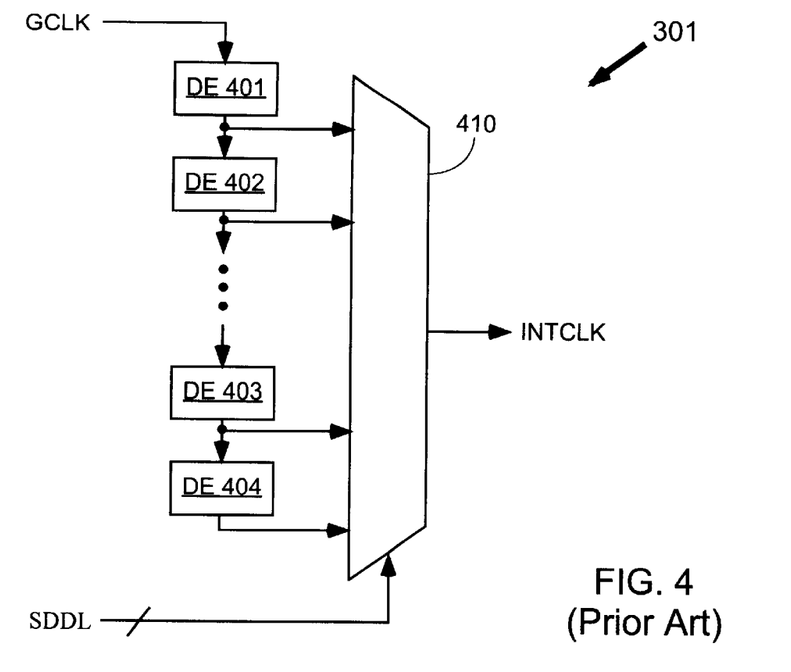
FIG. 4 is a block diagram of a tuneable delay line that can be used in the DLL of FIG. 3.

FIG. 4 shows a common implementation of tuneable delay line 301. The delay line of FIG. 4 includes a series of identical delay elements, e.g., inverter pairs (DE 401–404). Each delay element DE 401–404 through which the clock signal passes adds one unit delay to the clock signal. The output signals from the delay elements are tapped and passed to a multiplexer 410, which selects one of the output signals as including a delay closest to the desired delay "tm". Multiplexer 410 is controlled by control circuit 303 via select signals SDDL. The number of delay elements is typically much larger than four, but four delay elements are shown in FIG. 4 for exemplary purposes.

Figure 5:
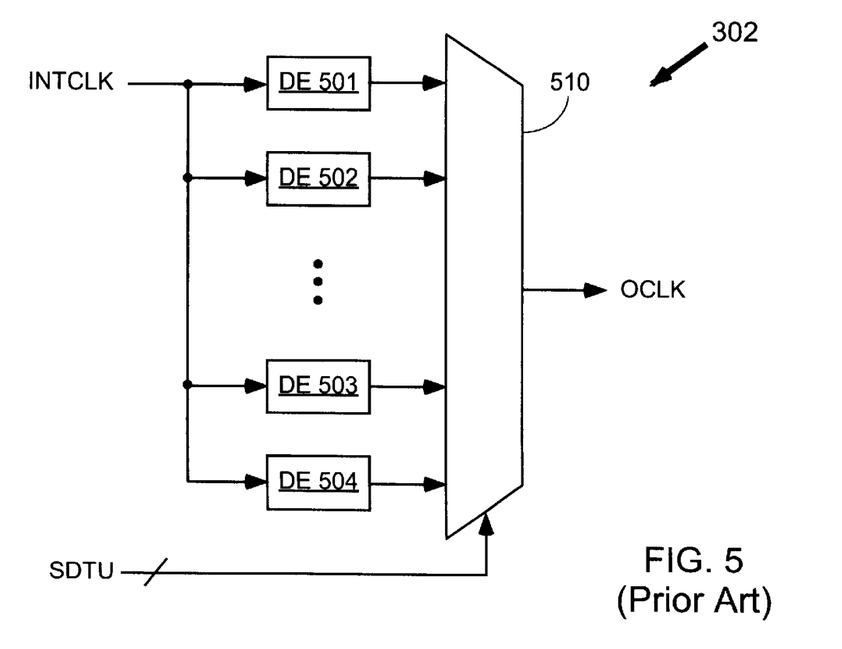
FIG. 5 is a block diagram of a prior art trim unit that can be used in the DLL of FIG. 3.

FIG. 5 shows a common implementation of trim unit 302. The delay elements used in the trim unit of FIG. 5 are coupled in parallel rather than in series, and they are not of uniform design. The clock signal driving the trim unit, INTCLK, is passed to each of the delay elements, each of which provides a slightly different delay. The output of each delay element is passed to multiplexer 510, which is controlled by control circuit 303 via select signals SDTU.

DLL circuits can be susceptible to variations in process and temperature, requiring constant adjustment in order to provide a reliable clock signal. These adjustments can cause jitter in the clock signals provided by the DLL circuits. It is desirable to reduce this jitter as much as possible by using DLL sub-circuits that are less sensitive to these variations. Therefore, it is desirable to provide a trim unit for a DLL delay line in which the delays remain balanced in spite of variations in process and temperature.

SUMMARY OF THE INVENTION

The invention provides a delay circuit having a delay that is consistent under varying process and temperature conditions. As in the prior art, the delay through a delay path is controlled by inserting resistors on the pull-up and pull-down paths of the delaying inverters (i.e., between the inverters and power high, and between the inverters and ground). However, the various resistors have resistance values that are determined by a number of similarly-sized transistors coupled in parallel across the resistor, rather than by varying the size of a single transistor. Select signals are used to control how many of the transistors are enabled. The total resistance of each plurality of transistors is determined by the number of transistors enabled within each plurality.

A first aspect of the invention provides a delay circuit that includes first and second inverters coupled in series. A plurality of first transistors are coupled in parallel between the first inverter and power high, and a plurality of second transistors are coupled in parallel between the second inverter and power high. Similarly, a plurality of third transistors are coupled in parallel between the first inverter and ground, and a plurality of fourth transistors are coupled in parallel between the second inverter and ground. The transistors within each plurality are all of the same size, and at least two of the transistors within each plurality (i.e., within each resistor) have gate terminals coupled to different select signals. In some embodiments, the sizes of the different pluralities of transistors are all different.

Because all of the transistors within each resistor are of the same size, the total resistance of each resistor varies in a predictable manner with the number of enabled transistors.

In one embodiment, the first and second transistors are P-channel transistors, while the third and fourth transistors are N-channel transistors. Within each plurality of transistors, a first transistor is coupled to power high (for the N-channel transistors) or ground (for the P-channel transistors).

Some embodiments include more than one delay circuit. A second delay circuit includes two inverters and four pluralities of transistors as described above, with an additional delay element on the path through the second delay circuit. These embodiments also include a multiplexer circuit that selects between the output signals from the two (or more) delay circuits. In some of these embodiments, the sizes of the transistors are the same in the different delay circuits.

Another aspect of the invention provides a variable delay line that includes two variable delay elements and a multiplexer circuit that selects between the output signals from the delay circuits. Each variable delay line is implemented substantially as described above.

Yet another aspect of the invention provides a delay-lock loop circuit (DLL) that includes a tuneable delay line and a trim unit circuit coupled in series, and a control circuit. The control circuit controls each of the tuneable delay line and the trim unit circuit. The trim unit circuit is implemented substantially as described above. In one embodiment, in which the DLL forms a portion of a programmable logic device (PLD), the resistor values of the variable delay elements are controlled by select values stored in configuration memory cells, and the multiplexer is controlled by the control circuit to select the output signal from one of the variable delay elements.

Another aspect of the invention provides a PLD that includes first and second configuration memory cells and a delay circuit, the delay circuit substantially as described above. One transistor of each of the first, second, third, and fourth pluralities of transistors has a gate terminal coupled to the first configuration memory cell. Another transistor of each of the first, second, third, and fourth pluralities of transistors has a gate terminal coupled to the second configuration memory cell. Thus, the value stored in the configuration memory cell controls the value of each resistor.

DETAILED DESCRIPTION OF THE DRAWINGS

The present invention has been found to be particularly applicable and beneficial for trim units and delay lines in delay-lock loop circuits (DLLs). While the present invention is not so limited, an appreciation of the present invention is presented by way of specific examples. In describing these examples, numerous specific details are set forth to provide a more thorough understanding of the present invention. However, it will be apparent to one skilled in the art that the present invention can be practiced without these specific details. Further, the trim units of the invention are described in an exemplary manner as being trim units for DLL delay lines. However, other applications of the circuits of the invention are equally valid.

Figure 6:
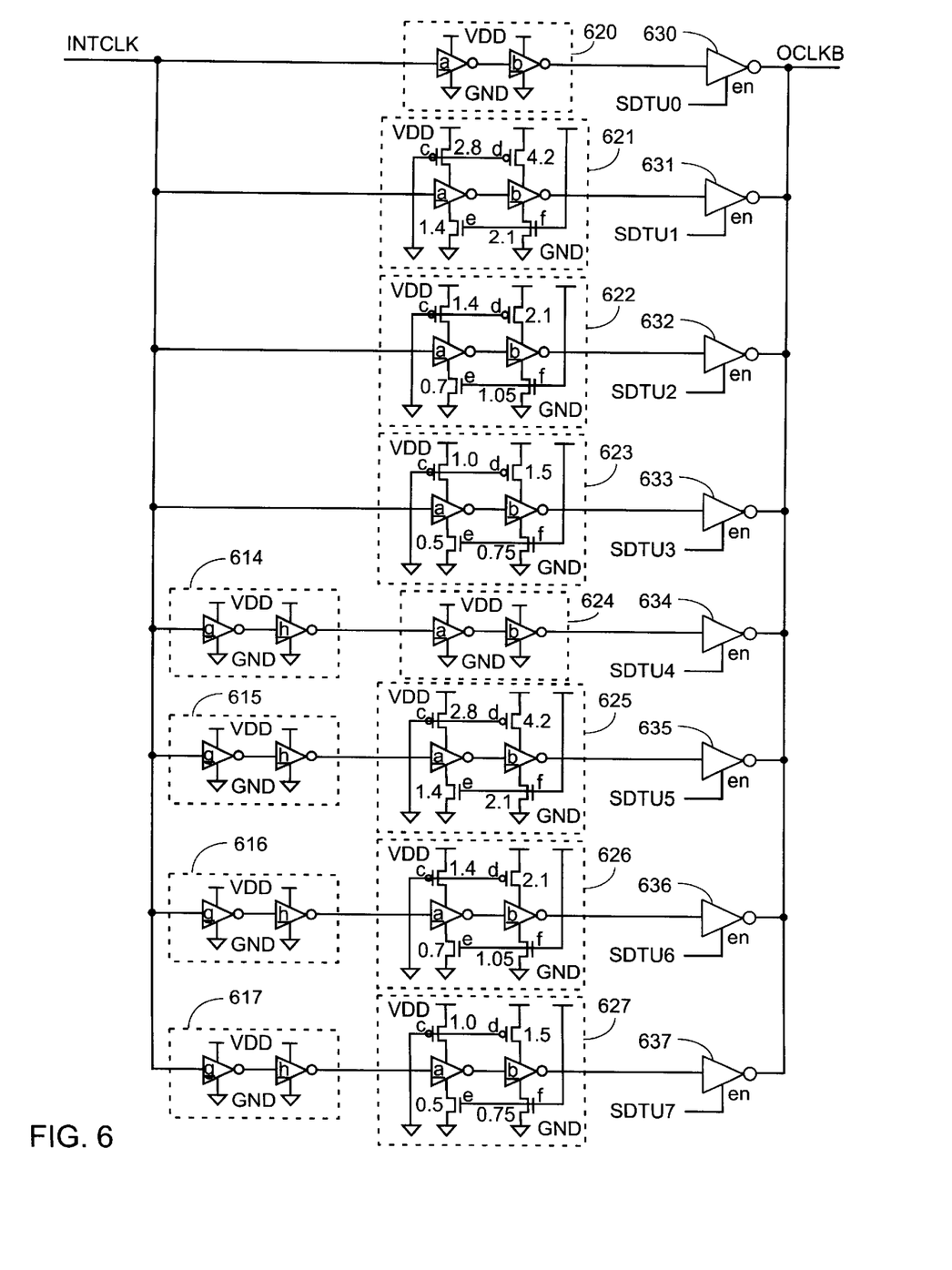
FIG. 6 is a circuit diagram showing one possible implementation of the trim unit of FIG. 5.

FIG. 6 shows one recently-developed implementation of the trim unit of FIG. 5. Eight different paths are provided between input clock signal INTCLK and output clock signal OCLKB, each having a different delay. Each delayed signal is provided to a different tristate buffer 630–637, at most one of which is active at a given time. Tristate buffers 630–637 together implement a multiplexer, e.g., multiplexer 510 of FIG. 5. The one active buffer is selected using select signals SDTU0–SDTU7, provided by control circuit 303 (see FIG. 3), and provides the selected delayed clock signal to output terminal OCLKB. (In the present specification, the same reference characters are used to refer to terminals, signal lines, and their corresponding signals.)

Note that in the trim unit of FIG. 6, the output clock signal has an inverse phase relationship with input clock signal INTCLK. If desired, the two signals can be given a matching phase by inserting an inverting buffer (e.g., an inverter) after the output terminal OCLKB.

The trim unit of FIG. 6 includes two instances (620, 624) of a delay element that comprises two inverters (a, b) coupled in series. This delay element can be, for example, the same as the unit delay element in the tuneable delay line. In this delay element, each of inverters "a" and "b" is coupled between power high VDD and ground GND.

Additional delay elements (621–623 and 625–627) are also provided that include similar inverters (a, b), but also include resistors coupled between the inverters and power high VDD and between the inverters and ground GND. (Power high VDD can be the same as the external power high voltage, or can be an internally regulated voltage level selected to provide the desired unit delay value.) These additional resistors add additional small amounts of delay to the base delay of the unit delay element. The amount of the added delay depends on the size of the resistors in the additional delay elements. In general, a wider transistor is faster (i.e., has less resistance) than a narrower transistor. As pictured in FIG. 6, the amount of delay increases gradually for each path, moving from the top towards the bottom of the figure.

Resistor "c" is a P-channel transistor gated by ground GND and coupled between inverter "a" and power high VDD. Resistor "d" is a P-channel transistor gated by ground GND and coupled between inverter "b" and power high VDD. Resistor "e" is an N-channel transistor gated by power high VDD and coupled between inverter "a" and ground GND. Resistor "f" is an N-channel transistor gated by power high VDD and coupled between inverter "b" and ground GND.

Four of the eight paths through the trim unit of FIG. 6 also include an additional delay element 614–617. The additional delay element includes two inverters (g, h) coupled in series. In one implementation of the circuit, delay elements 614–617 each have a delay equal to the delay of delay elements 620 and 624. The transistors in inverters g, h are sized such that the difference in loading is compensated, equalizing the delays of the two delay elements. In one implementation, the delays through the eight paths, starting at the top of the figure, correspond to 0.5, 0.625, 0.75, 0.875, 1.0, 1.125, 1.25, and 1.375 unit delays.

FIG. 6 shows the gate widths in microns of the transistors implementing the resistors of an exemplary prior art trim unit. For all of the pictured transistors, the gate length is 0.11 microns. The transistor sizes for inverters a, b, g, and h are shown in Table 1. (Dimensions are in microns.)

TABLE 1

| Inverter | P-channel | N-channel |
|---|---|---|
| a | 0.68/0.12 | 0.65/0.12 |
| b | 1.01/0.12 | 1.01/0.12 |
| g | 0.30/0.12 | 0.30/0.12 |
| h | 0.45/0.12 | 0.45/0.12 |

FIG. 6 illustrates the important fact that the through-delay of each of the additional delay elements is determined by the sizes of the transistors implementing the resistors (c, d, e, f) for the paired inverters.

The practice of using differently-sized transistors to provide small differences in delay has its drawbacks. The primary disadvantage is that differently-sized transistors respond differently to variations in process and temperature. For example, assume the presence of two P-channel transistors of sizes 2.8/0.11 (width/length) and 1.4/0.11. The ratio of gate widths is 2.8:1.4, or 2:1. Now assume that process variation results in the loss of 0.2 microns of gate width on either side of the gate. The new ratio between the gate widths is 2.4:1. Therefore, the ratio of resistance values has changed. Differently-sized gates also react differently to changes in temperature, which often occur in IC applications. These variations are particularly undesirable in certain critical applications such as in DLL trim units, where they can cause unacceptable jitter.

Figure 7:
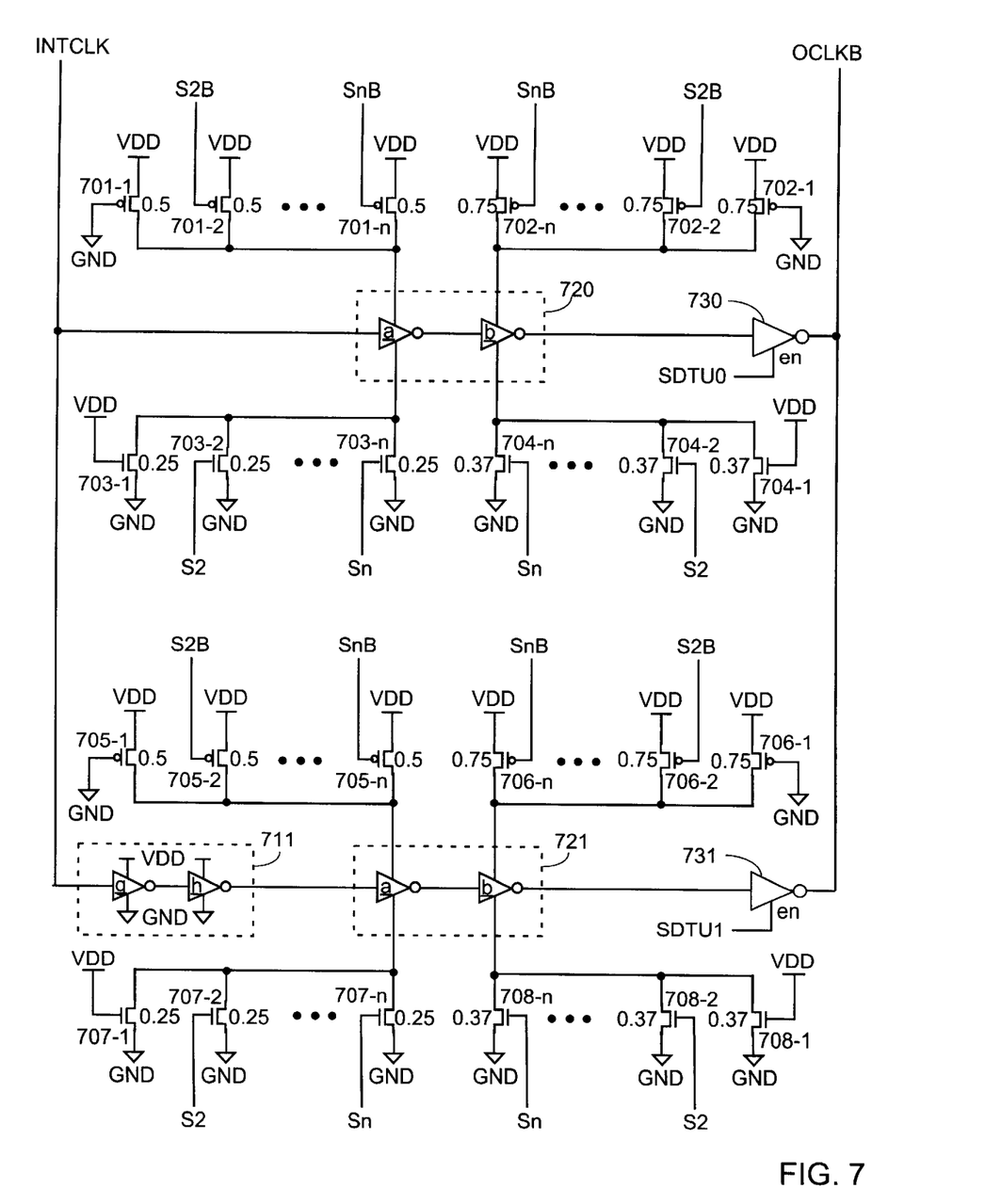
FIG. 7 is a circuit diagram of a trim unit that can be used (for example) in the DLL of FIG. 3, according to one embodiment of the present invention.

FIG. 7 illustrates a trim unit designed to keep the delays balanced in spite of variations in process and temperature. This advantage is provided by using a number of transistors of the same size, coupled in parallel, to implement a resistor. The delay of each path is set by enabling a selected number of these transistors.

The trim unit of FIG. 7 includes two different delay paths, with a multiplexer that selects between the two paths. However, while only two delay paths are shown in FIG. 7, the invention is not limited to circuits that include only two delay paths. A trim unit similar to that of FIG. 7 can include only one delay path, or can include three or more delay paths.

Note that the trim unit of FIG. 7 is controlled by two different sets of select signals. The values of the resistors are controlled by select signals S2–Sn and S2B–SnB, which are inverses of each other. (Signal S2B is the inverse of signal S2, for example.) These values control the path delay for each path by selecting the number of transistors that are enabled in each resistor.

For example, consider the resistor formed by P-channel transistors 701-1 through 701-n, which are coupled in parallel between inverter "a" of delay element 720 and power high VDD. Transistor 701-1 is always on, because its gate terminal is coupled to ground GND. If, for example, one other of select signals S2B–SnB is low, then two transistors are coupled in parallel across the resistor. The resulting resistance is half that of one transistor alone.

Therefore, the delays through the various paths are controlled by signals S2–Sn and S2B–SnB. When the trim unit is part of a DLL in a programmable logic device (PLD), for example, the values of these signals can stored in configuration memory cells. The most desirable delays (i.e., the most desirable resistance values) can be determined by experimentation, and the resulting values can be programmed into the PLD as part of the PLD configuration process. In some embodiments, the resulting values are permanently hard-coded into the PLD, by altering the mask set or by storing permanent values into read-only memory (ROM), for example.

This PLD embodiment is particularly useful in providing low-jitter DLL capability to PLD customers. The delays encountered in DLL circuits can have a significant impact on the amount of jitter and the consequent "signal locking" capability of the DLL. Therefore, the DLL delays are preferably carefully adjusted to provide the best DLL performance in these areas. However, the delays that will result when a new fabrication process is introduced are difficult to predict accurately. By including a trim unit such as that shown in FIG. 7, a PLD can be manufactured, tested in the laboratory to determine the most advantageous number of transistors in each resistor, and the number of transistors can be programmed into the PLD without having to create a new mask set for the PLD.

The second set of select signals that control the operation of the trim unit are the select signals that control the multiplexer selecting between the delay paths. In the embodiment of FIG. 7, this multiplexer includes tristate buffers 730 and 731, and is controlled by select signals SDTU0 and SDTU1. When the trim unit is part of a DLL circuit, for example, select signals SDTU0 and SDTU1 can be provided by a control circuit such as control circuit 303 of FIG. 3. In another embodiment that also includes two delay paths, a single select signal is used to select one of the two delay paths.

A first delay path through the trim unit of FIG. 7 traverses delay element 720 and tristate buffer 730. Delay element 720 includes two inverters (a, b) coupled in series. Coupled between inverter "a" and power high VDD is a first resistor implemented as n P-channel transistors (701-1, 701-2, . . . , 701-n) coupled in parallel. These transistors are all of the same size (in the pictured embodiment 0.5 microns in width and 0.11 microns in length), which uniformity gives the trim circuit its consistent performance under varying process and operating conditions. Transistor 701-1 is always on, being a P-channel transistor with its gate terminal coupled to ground. Transistors 701-2 through 701-n are controlled by select signals S2B–SnB.

Similarly, a second resistor between inverter "b" and VDD is implemented using n P-channel transistors (702-1, 702-2, . . . , 702-n) coupled in parallel. These transistors are all of the same size (in the pictured embodiment 0.75 microns in width and 0.11 microns in length). Transistor 702-1 is always on, being a P-channel transistor with its gate terminal coupled to ground. Transistors 702-2 through 702-n are controlled by select signals S2B–SnB.

A third resistor between inverter "a" and ground GND is implemented using n N-channel transistors (703-1, 703-2, .

..., 703-n) coupled in parallel. These transistors are all of the same size (in the pictured embodiment 0.25 microns in width and 0.11 microns in length). Transistor 703-1 is always on, being an N-channel transistor with its gate terminal coupled to VDD. Transistors 703-2 through 703-n are controlled by select signals S2–Sn, which are the inverse signals of select signals S2B–Sn.

Similarly, a fourth resistor between inverter "b" and ground GND is implemented using n N-channel transistors (704-1, 704-2, . . . , 704-n) coupled in parallel. These transistors are all of the same size (in the pictured embodiment 0.37 microns in width and 0.11 microns in length). Transistor 704-1 is always on, being an N-channel transistor with its gate terminal coupled to VDD. Transistors 704-2 through 704-n are controlled by select signals S2–Sn.

The number of transistors in each of the first through fourth resistors is different in different embodiments. The number of transistors can depend, for example, on the degree of unpredictability expected as a result of processing or temperature variation. The maximum number of transistors in each resistor is limited only by factors such as available silicon area, the number of available select signals, and so forth.

In the pictured embodiment, one of the transistors in each resistor is always enabled. In other embodiments (not shown), each of the transistors is controlled by a select signal. In one such embodiment, at least one of the select signals is always at an enable value.

The output of delay element 720 drives tristate buffer 730, which is enabled by a high value on select signal SDTU0, i.e., tristated by a low value on select signal SDTU0.

A second delay path through the trim unit of FIG. 7 traverses delay element 721 and tristate buffer 731. Delay element 721 and the resistors coupled thereto are similar to those on the first delay path, which was previously described. Therefore, that description is not repeated. The output of delay element 721 drives tristate buffer 731, which is enabled by a high value on select signal SDTU1. At most one of select signals SDTU0 and SDTU1 is high at any given time, to avoid contention on the output terminal OCLKB.

The second delay path also traverses delay element 711, which comprises two inverters (a, b) coupled in series. Delay element 711 is a fixed delay element, i.e., the delay is not selectable. Delay element 711 provides a fixed delay that differentiates the delays on the first and second delay paths. Delay element 711 can precede or follow delay element 721 on the second delay path.

In the pictured embodiment, inverters "a" and "b" in delay element 711 are similarly-sized (i.e., include similarly-sized transistors) with the corresponding inverters "a" and "b" in delay elements 720 and 721. However, in other embodiments, this is not the case. In one embodiment, delay element 711 is similar to one unit delay element in an associated tuneable delay line.

Note that in the trim unit of FIG. 7, the output clock signal OCLKB has an inverse phase relationship with input clock signal INTCLK. If desired, the two signals can be given a matching phase by inserting an inverting buffer (e.g., an inverter) after the output terminal OCLKB.

In some embodiments, the trim unit of FIG. 7 forms a portion of a PLD. In some of these embodiments, the resistor values of the variable delay elements are controlled by select values stored in configuration memory cells. For example, referring to FIG. 7, values S2 and S2B can be stored in a first configuration memory cell, values S3 and S3B (not shown) can be stored in a second memory cell, and so forth. The multiplexer (e.g., tristate buffers 730 and 731 in FIG. 7) is controlled by the control circuit (e.g., control circuit 303 of FIG. 3) to select the output signal from one of the variable delay elements.

Figure 8:
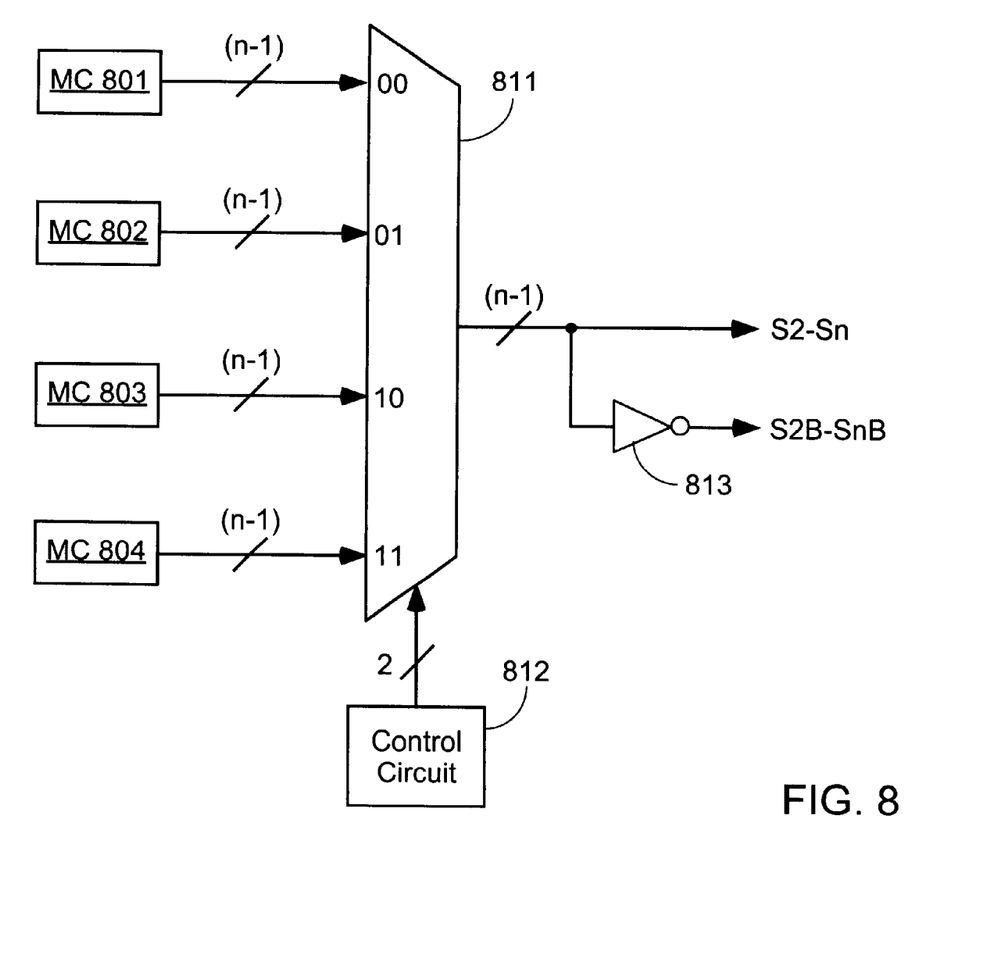
FIG. 8 is a circuit diagram showing how configuration memory cells can be used to control the delays of the variable delay elements according to one embodiment of the present invention.

FIG. 8 illustrates another way in which configuration memory cells can be used to control the delays of the variable delay elements according to another embodiment of the present invention. FIG. 8 is a circuit diagram showing one way in which the values of signals S2–Sn and S2B–SnB of FIG. 7 can be derived from values stored in configuration memory cells. The circuit of FIG. 8 provides four different sets of values for signals S2–Sn and S2B–SnB. Control signals SDTU0 and SDTU1 provide an additional selection between two delay paths. Thus, when the circuit of FIG. 8 is used in the embodiment of FIG. 7, any of eight different delays can be selected.

The circuit of FIG. 8 includes four sets of memory cells (MC 801–804). Each set of memory cells includes n–1 memory cells providing n–1 stored values, where n is the number of transistors in each variable resistor (see FIG. 7). Each set of memory cells 801–804 provides n–1 values to 4-to-1 multiplexer 811. Under the control of a control circuit 812, multiplexer 811 selects one set of memory cells and passes the n–1 selected values to the trim unit as signals S2–Sn. Signals S2–Sn are also inverted by n–1 inverters 813 and provided to the trim unit as signals S2B–SnB.

Control circuit 812 can also be designed to provide signals SDTU0 and SDTU1 of FIGS. 3 and 7.

Those having skill in the relevant arts of the invention will now perceive various modifications and additions that may be made as a result of the disclosure herein. For example, the above text describes the circuits of the invention in the context of trim units and delay lines in DLLs. However, the circuits of the invention can also be implemented in other electronic circuits and systems. For example, the concepts of the invention can be applied to any delay line.

Further, resistors, transistors, P-channel transistors, N-channel transistors, inverters, inverting buffers, tristate buffers, delay elements, multiplexers, delay lines, control circuits, DLLs, PLDs, and other components other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A circuit, comprising:
   a circuit input terminal;
   a circuit output terminal;
   first and second select input terminals;
   first and second inverters coupled in series between the circuit input terminal and the circuit output terminal;
   a plurality of first transistors coupled in parallel between the first inverter and power high, the first transistors all being of a first size;
   a plurality of second transistors coupled in parallel between the second inverter and the power high, the second transistors all being of a second size;

a plurality of third transistors coupled in parallel between the first inverter and ground, the third transistors all being of a third size; and a plurality of fourth transistors coupled in parallel between the second inverter and the ground, the fourth transistors all being of a fourth size, wherein a first one of each plurality of transistors has a gate terminal coupled to the first select input terminal, and a second one of each plurality of transistors has a gate terminal coupled to the second select input terminal.

2. The circuit of claim 1, wherein the first, second, third, and fourth sizes are all different.

3. The circuit of claim 1, wherein the first and second transistors are P-channel transistors.

4. The circuit of claim 3, wherein:

a third one of the first transistors has a gate terminal coupled to the ground; and a third one of the second transistors has a gate terminal coupled to the ground.

5. The circuit of claim 3, wherein the third and fourth transistors are N-channel transistors.

6. The circuit of claim 5, wherein:

a third one of the third transistors has a gate terminal coupled to the power high; and a third one of the fourth transistors has a gate terminal coupled to the power high.

7. The circuit of claim 1, further comprising:

a multiplexer circuit having a first data input terminal coupled to an output terminal of the second inverter, a second data input terminal, a first control input terminal, and an output terminal coupled to the circuit output terminal;

a delay element;

third and fourth inverters coupled in series with the delay element between the circuit input terminal and the second data input terminal of the multiplexer circuit;

a plurality of fifth transistors coupled in parallel between the third inverter and the power high, the fifth transistors all being of a fifth size;

a plurality of sixth transistors coupled in parallel between the fourth inverter and the power high, the sixth transistors all being of a sixth size;

a plurality of seventh transistors coupled in parallel between the third inverter and the ground, the seventh transistors all being of a seventh size; and a plurality of eighth transistors coupled in parallel between the fourth inverter and the ground, the eighth transistors all being of an eighth size.

8. The circuit of claim 7, wherein the first and third inverters are similarly-sized with one another, and wherein the second and fourth inverters are similarly-sized with one another.

9. The circuit of claim 7, wherein the delay element comprises fifth and sixth inverters coupled in series.

10. The circuit of claim 9, wherein the first, third, and fifth inverters are similarly-sized with one another, and wherein the second, fourth, and sixth inverters are similarly sized with one another.

11. The circuit of claim 7, wherein:

the first and fifth sizes are the same;

the second and sixth sizes are the same;

the third and seventh sizes are the same; and the fourth and eighth sizes are the same.

12. The circuit of claim 7, wherein the multiplexer circuit comprises:

a second control input terminal;

a first tristate buffer having an input terminal coupled to the first data input terminal of the multiplexer circuit, an enable terminal coupled to the first input control terminal, and an output terminal coupled to the output terminal of the multiplexer circuit; and a second tristate buffer having an input terminal coupled to the second data input terminal of the multiplexer circuit, an enable terminal coupled to the second control input terminal, and an output terminal coupled to the output terminal of the multiplexer circuit.

13. A variable delay line, comprising:

a delay line input terminal;

a delay line output terminal;

a multiplexer circuit having a first data input terminal, a second data input terminal, a first control input terminal, and an output terminal coupled to the delay line output terminal;

a first variable delay element having an input terminal coupled to the delay line input terminal, first and second select input terminals, and an output terminal coupled to the first data input terminal of the multiplexer circuit;

a fixed delay element; and a second variable delay element coupled in series with the fixed delay element between the delay line input terminal and the second data input terminal of the multiplexer circuit, the second variable delay element having an input terminal, first and second select input terminals, and an output terminal, wherein each of the first and second variable delay elements comprises:

first and second inverters coupled in series between the input terminal and the output terminal of the variable delay element;

a plurality of first transistors coupled in parallel between the first inverter and power high, the first transistors all being of a first size;

a plurality of second transistors coupled in parallel between the second inverter and the power high, the second transistors all being of a second size;

a plurality of third transistors coupled in parallel between the first inverter and ground, the third transistors all being of a third size; and a plurality of fourth transistors coupled in parallel between the second inverter and the ground, the fourth transistors all being of a fourth size, wherein a first one of each plurality of transistors has a gate terminal coupled to the first select input terminal of the variable delay element, and a second one of each plurality of transistors has a gate terminal coupled to the second select input terminal of the variable delay element.

14. The variable delay line of claim 13, wherein for each of the first and second variable delay elements the first, second, third, and fourth sizes are all different.

15. The variable delay line of claim 13, wherein for each of the first and second variable delay elements the first and second transistors are P-channel transistors.

16. The variable delay line of claim 13, wherein for each of the first and second variable delay elements:

one of the first transistors has a gate terminal coupled to the ground; and one of the second transistors has a gate terminal coupled to the ground.

17. The variable delay line of claim 15, wherein for each of the first and second variable delay elements the third and fourth transistors are N-channel transistors.

18. The variable delay line of claim 17, wherein for each of the first and second variable delay elements:
   one of the third transistors has a gate terminal coupled to the power high; and
   one of the fourth transistors has a gate terminal coupled to the power high.

19. The variable delay line of claim 13, wherein the multiplexer circuit comprises:
   a second control input terminal;
   a first tristate buffer having an input terminal coupled to the output terminal of the first variable delay element, an enable terminal coupled to the first control input terminal, and an output terminal coupled to the delay line output terminal; and
   a second tristate buffer having an input terminal coupled to the output terminal of the second variable delay element, an enable terminal coupled to the second control input terminal, and an output terminal coupled to the delay line output terminal.

20. A delay-lock loop circuit (DLL), comprising:
   a DLL input terminal;
   a feedback input terminal;
   a DLL output terminal;
   a control circuit having input terminals coupled to the DLL input terminal and the feedback input terminal, and further having first and second output terminals;
   a tuneable delay line having an input terminal coupled to the DLL input terminal, a select terminal coupled to the first output terminal of the control circuit, and an output terminal; and
   a trim unit circuit, comprising:
      a multiplexer circuit having first and second data input terminals, a control input terminal coupled to the second output terminal of the control circuit, and an output terminal coupled to the DLL output terminal;
      a first variable delay element having an input terminal coupled to the output terminal of the tuneable delay line, first and second select input terminals, and an output terminal coupled to the first data input terminal of the multiplexer circuit;
      a fixed delay element; and
      a second variable delay element coupled in series with the fixed delay element between the output terminal of the tuneable delay line and the second data input terminal of the multiplexer circuit, the second variable delay element having an input terminal, first and second select input terminals, and an output terminal,
      wherein each of the first and second variable delay elements comprises:
         first and second inverters coupled in series between the input terminal and the output terminal of the variable delay element;
         a plurality of first transistors coupled in parallel between the first inverter and power high, the first transistors all being of a first size;
         a plurality of second transistors coupled in parallel between the second inverter and the power high, the second transistors all being of a second size;
         a plurality of third transistors coupled in parallel between the first inverter and ground, the third transistors all being of a third size; and
         a plurality of fourth transistors coupled in parallel between the second inverter and the ground, the fourth transistors all being of a fourth size,
         wherein a first one of each plurality of transistors has a gate terminal coupled to the first select input terminal of the variable delay element, and a second one of each plurality of transistors has a gate terminal coupled to the second select input terminal of the variable delay element.

21. The DLL of claim 20, wherein the DLL further comprises:
   a first memory cell coupled to the first select input terminals of the first and second variable delay elements; and
   a second memory cell coupled to the second select input terminals of the first and second variable delay elements.

22. The DLL of claim 21, wherein the DLL forms a portion of a programmable logic device (PLD), and the first and second memory cells are configuration memory cells of the PLD.

23. The DLL of claim 20, wherein for each of the first and second variable delay elements the first, second, third, and fourth sizes are all different.

24. The DLL of claim 20, wherein for each of the first and second variable delay elements the first and second transistors are P-channel transistors.

25. The DLL of claim 24, wherein for each of the first and second variable delay elements:
   one of the first transistors has a gate terminal coupled to the ground; and
   one of the second transistors has a gate terminal coupled to the ground.

26. The DLL of claim 24, wherein for each of the first and second variable delay elements the third and fourth transistors are N-channel transistors.

27. The DLL of claim 26, wherein for each of the first and second variable delay elements:
   one of the third transistors has a gate terminal coupled to the power high; and
   one of the fourth transistors has a gate terminal coupled to the power high.

28. The DLL of claim 20, wherein the multiplexer circuit comprises:
   a second control input terminal;
   a first tristate buffer having an input terminal coupled to the output terminal of the first variable delay element, an enable terminal coupled to the first control input terminal, and an output terminal coupled to the DLL output terminal; and
   a second tristate buffer having an input terminal coupled to the output terminal of the second variable delay element, an enable terminal coupled to the second control input terminal, and an output terminal coupled to the DLL output terminal.

29. A programmable logic device (PLD), comprising:
   first and second configuration memory cells;
   a circuit input terminal;
   a circuit output terminal;
   first and second inverters coupled in series between the circuit input terminal and the circuit output terminal;

a plurality of first transistors coupled in parallel between the first inverter and power high, the first transistors all being of a first size;

a plurality of second transistors coupled in parallel between the second inverter and the power high, the second transistors all being of a second size;

a plurality of third transistors coupled in parallel between the first inverter and ground, the third transistors all being of a third size; and a plurality of fourth transistors coupled in parallel between the second inverter and the ground, the fourth transistors all being of a fourth size, wherein a first one of each plurality of transistors has a gate terminal coupled to the first configuration, memory cell, and a second one of each plurality of transistors has a gate terminal coupled to the second configuration memory cell.

* * * * *